(12) United States Patent
Henry et al.

(10) Patent No.: US 12,119,577 B2
(45) Date of Patent: Oct. 15, 2024

(54) ELECTRONIC ASSEMBLY FOR A COMMUNICATION SYSTEM

(71) Applicant: TE Connectivity Solutions GmbH, Schaffhausen (CH)

(72) Inventors: Randall Robert Henry, Lebanon, PA (US); Brandon Michael Matthews, McAlisterville, PA (US)

(73) Assignee: TE CONNECTIVITY SOLUTIONS GmbH, Schaffhausen (CH)

( * ) Notice: Subject to any disclaimer, the term of this patent is extended or adjusted under 35 U.S.C. 154(b) by 384 days.

(21) Appl. No.: 17/708,006

(22) Filed: Mar. 30, 2022

(65) Prior Publication Data

US 2023/0318210 A1 Oct. 5, 2023

(51) Int. Cl.
| | |
|---|---|
| H01R 12/79 | (2011.01) |
| G06F 1/18 | (2006.01) |
| H01R 12/53 | (2011.01) |
| H01R 12/71 | (2011.01) |
| H01R 13/512 | (2006.01) |
| H05K 1/11 | (2006.01) |
| H05K 1/18 | (2006.01) |

(52) U.S. Cl.
CPC ............ *H01R 12/714* (2013.01); *G06F 1/183* (2013.01); *H01R 12/53* (2013.01); *H01R 13/512* (2013.01); *H05K 1/119* (2013.01); *H05K 1/18* (2013.01); *H05K 2201/09027* (2013.01); *H05K 2201/09063* (2013.01); *H05K 2201/09081* (2013.01); *H05K 2201/10356* (2013.01)

(58) Field of Classification Search
CPC ........ H01R 12/73; H01R 12/714; G06F 1/182
See application file for complete search history.

(56) References Cited

U.S. PATENT DOCUMENTS

| | | | | |
|---|---|---|---|---|
| 5,310,352 | A * | 5/1994 | Mroczkowski | H01R 13/24 439/378 |
| 5,676,562 | A * | 10/1997 | Fukuda | H05B 3/84 439/329 |
| 5,846,097 | A * | 12/1998 | Marian, Jr. | H01R 13/533 439/372 |
| 7,156,678 | B2 * | 1/2007 | Feldman | H01R 12/712 439/326 |
| 7,540,773 | B2 * | 6/2009 | Ko | H01R 13/5808 439/607.17 |
| 7,914,320 | B2 * | 3/2011 | Ko | H01R 13/7175 439/490 |

(Continued)

*Primary Examiner* — Neil Abrams

(57) ABSTRACT

A cable connector module includes a cable card assembly including a circuit card, cables terminated to the circuit card, and a cable holder coupled to the circuit card and holding the cables relative to the circuit card. The cables include cable conductors electrically connected to corresponding cable contacts of the circuit card. The cable holder holds each of the contacts and includes a connecting tab coupled to the circuit card. The circuit card includes front and rear retaining tabs. The cable connector module includes a connector shell having a cavity that receives the cable card assembly. The connector shell includes a front retainer at the front receiving the front retaining tab to hold the front of the circuit card relative to the connector shell. The connector shell includes a rear retainer at the rear receiving the rear retaining tab to hold the rear of the circuit card relative to the connector shell.

20 Claims, 8 Drawing Sheets

(56) References Cited

U.S. PATENT DOCUMENTS

| | | | | |
|---|---|---|---|---|
| 9,225,090 B2* | 12/2015 | Chen | ............... | H05K 3/361 |
| 9,722,333 B2* | 8/2017 | Halbig | ............... | H01R 4/02 |
| 9,812,832 B2* | 11/2017 | Su | ............... | H01R 27/02 |
| 9,979,122 B1* | 5/2018 | Nakamura | ............... | H01R 13/6273 |
| 2019/0288422 A1* | 9/2019 | Champion | ............... | H01R 13/6587 |
| 2022/0278484 A1* | 9/2022 | Simpson | ............... | H01R 13/5833 |
| 2023/0318210 A1* | 10/2023 | Henry | ............... | H01R 12/714 |
| | | | | 439/74 |

* cited by examiner

ELECTRONIC ASSEMBLY FOR A COMMUNICATION SYSTEM

BACKGROUND OF THE INVENTION

The subject matter herein relates generally to communication systems.

There is an ongoing trend toward smaller, lighter, and higher performance communication components and higher density systems, such as for ethernet switches or other system components. Typically, the system includes an electronic package coupled to a circuit board, such as through a socket connector. Electrical signals are routed between the electronic package and the circuit board. The electrical signals are then routed along traces on the circuit board to another component, such as a transceiver connector. The long electrical paths through the host circuit board reduce electrical performance of the system. Additionally, losses are experienced between the connector interfaces and along the electrical signal paths of the transceivers. Conventional systems are struggling with meeting signal and power output from the electronic package. Some known systems utilize optical modules to transmit data to improve performance. However, the optical modules typically require different socket connectors to mate the optical modules to the system compared to the electrical modules.

A need remains for a communication system having interchangeable interfaces for various components to reduce part count for the communication system.

BRIEF DESCRIPTION OF THE INVENTION

In one embodiment, a cable connector module is provided and includes a cable card assembly including a circuit card, cables terminated to the circuit card, and a cable holder coupled to the circuit card and holding the cables relative to the circuit card. The circuit card has a mating portion at a front of the circuit card and a cable portion at a rear of the circuit card. The circuit card includes mating contacts at the mating end configured for mating with interposer contacts of an interposer assembly. The circuit card includes cable contacts at the cable end. The cables include cable conductors electrically connected to the corresponding cable contacts. The cable holder holding each of the contacts. The cable holder includes at least one connecting tab coupled to the circuit card. The circuit card includes a front retaining tab at the front and a rear retaining tab at the rear. The cable connector module includes a connector shell having a cavity that receives the cable card assembly. The connector shell has a front and a rear. The connector shell has sides between the front and the rear. The connector shell has a top wall between the front and the rear. The connector shell includes a front retainer at the front receiving the front retaining tab to hold the front of the circuit card relative to the connector shell. The connector shell includes a rear retainer at the rear receiving the rear retaining tab to hold the rear of the circuit card relative to the connector shell.

In another embodiment, a cable connector module is provided and includes a cable card assembly including a circuit card, cables terminated to the circuit card, and a cable holder coupled to the circuit card and holding the cables relative to the circuit card. The circuit card has a mating portion at a front of the circuit card and a cable portion at a rear of the circuit card. The circuit card includes mating contacts at the mating end configured for mating with interposer contacts of an interposer assembly. The circuit card includes cable contacts at the cable end. The cables include cable conductors electrically connected to the corresponding cable contacts. The cable holder holding each of the contacts. The cable holder includes at least one connecting tab coupled to the circuit card. The cable holder includes guide lugs along first and second sides of the cable holder. The cable connector module includes a connector shell having a cavity that receives the cable card assembly. The connector shell has a front and a rear. The connector shell has first and second sides between the front and the rear. The connector shell has a top wall between the front and the rear. The connector shell includes guide slots formed in the first and second sides proximate to the rear of the connector shell. The guide slots receive the guide lugs of the cable holder. The connector shell includes a retainer coupled to the rear of the connector shell. The retainer covers the guide lugs to retain the cable holder in the cavity and hold the circuit card relative to the connector shell.

In a further embodiment, an electronic assembly is provided and includes an interposer assembly including an array of interposer contacts. The interposer contacts are compressible. Each interposer contact has an upper mating interface and a lower mating interface. The upper mating interfaces defines separable mating interfaces. The lower mating interfaces of the interposer contacts are configured to be electrically connected to board contacts of a circuit board. The electronic assembly includes a cable connector module coupled to the interposer assembly. The cable connector module includes a cable card assembly and a connector shell having a cavity that receives the cable card assembly. The cable card assembly includes a circuit card, cables terminated to the circuit card, and a cable holder coupled to the circuit card and holding the cables relative to the circuit card. The circuit card has a mating portion at a front of the circuit card and a cable portion at a rear of the circuit card. The circuit card includes mating contacts at the mating end configured for mating with socket contacts of a socket. The circuit card includes cable contacts at the cable end. The cables include cable conductors electrically connected to the corresponding cable contacts. The circuit card includes a front retaining tab at the front and a rear retaining tab at the rear. The cable holder holding each of the contacts. The cable holder includes at least one connecting tab coupled to the circuit card. The cable holder includes guide lugs along first and second sides of the cable holder. The connector shell has a front and a rear. The connector shell has first and second sides between the front and the rear. The connector shell has a top wall between the front and the rear. The connector shell includes guide slots formed in the first and second sides proximate to the rear of the connector shell. The guide slots receiving the guide lugs of the cable holder. The connector shell includes a front retainer at the front receiving the front retaining tab to hold the front of the circuit card relative to the connector shell. The connector shell includes a rear retainer at the rear receiving the rear retaining tab to hold the rear of the circuit card relative to the connector shell. The rear retainer covering the guide lugs to retain the cable holder in the cavity.

DETAILED DESCRIPTION OF THE INVENTION

Figure 1:
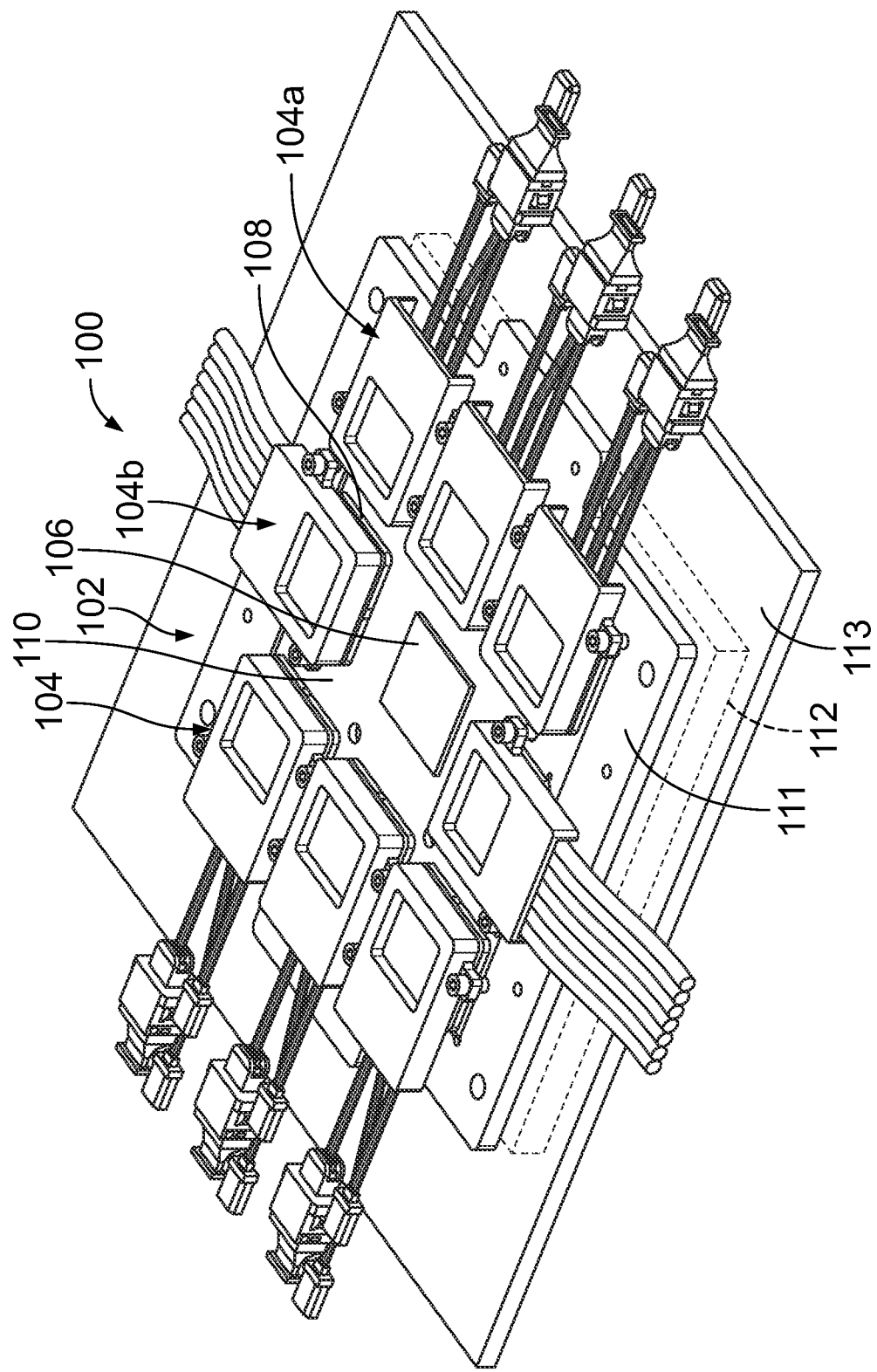
FIG. 1 is a top view of a communication system having an electronic assembly in accordance with an exemplary embodiment.

FIG. 1 is a top view of a communication system 100 having an electronic assembly 102 in accordance with an exemplary embodiment. The electronic assembly 102 includes one or more cable connector modules 104 electrically connected to a circuit board 110 by interposer assemblies 108. An electronic package 106 is electrically connected to the circuit board 110. The cable connector modules 104 are electrically connected to the electronic package 106 through the circuit board 110. A stiffener plate 111 may surround the circuit board 110 to provide support for the circuit board 110. In various embodiments, the cable connector modules 104 include optical modules 104a using fiber optic cables for data transmission and/or electrical modules 104b using electrical conductors to transmit electrical data signals. In an exemplary embodiment, the optical modules 104a and the electrical modules 104b have identical mating interfaces for mating with the interposer assemblies 108. As such, any combination of the optical modules 104a and/or electrical modules 104b may be coupled to any of the interposer assemblies 108 within the communication system 100.

In an exemplary embodiment, compression elements are used to load the cable connector modules 104 against the interposer assemblies 108 to electrically connect the cable connector modules 104 to the interposer assemblies 108 and to electrically connect the interposer assemblies 108 to the circuit board 110. For example, internal compression elements, such as springs, of the cable connector modules 104 may press components downward to load the interposer assemblies 108 and create mechanical and electrical connections between the cable connector modules 104 and the interposer assemblies 108. In an exemplary embodiment, the communication system 100 includes heat dissipating elements (not shown) to dissipate heat from the electronic package 106 and/or the cable connector modules 104.

In various embodiments, the electronic package 106 may be an integrated circuit assembly, such as an ASIC. However, the electronic package 106 may be another type of communication component. The electronic package 106 may be mounted to the circuit board 110. For example, the circuit board 110 may be a package substrate mounted to a host circuit board 113 separate from the package substrate. In other various embodiments, the system is provided without the host circuit board 113. Rather, the circuit board 110 may be a host circuit board and the electronic package may be mounted directly thereto. Optionally, the cable connector modules 104 may be provided on multiple sides of the circuit board 110. In the illustrated embodiment, the cable connector modules 104 are provided on multiple sides of the electronic package 106, such as on all four sides of the electronic package 106. Other arrangements are possible in alternative embodiments. In various embodiments, the cable connector modules 104 are individually clamped or compressed against the interposer assemblies 108 and are thus individually serviceable and removable from the circuit board 110.

Figure 2:
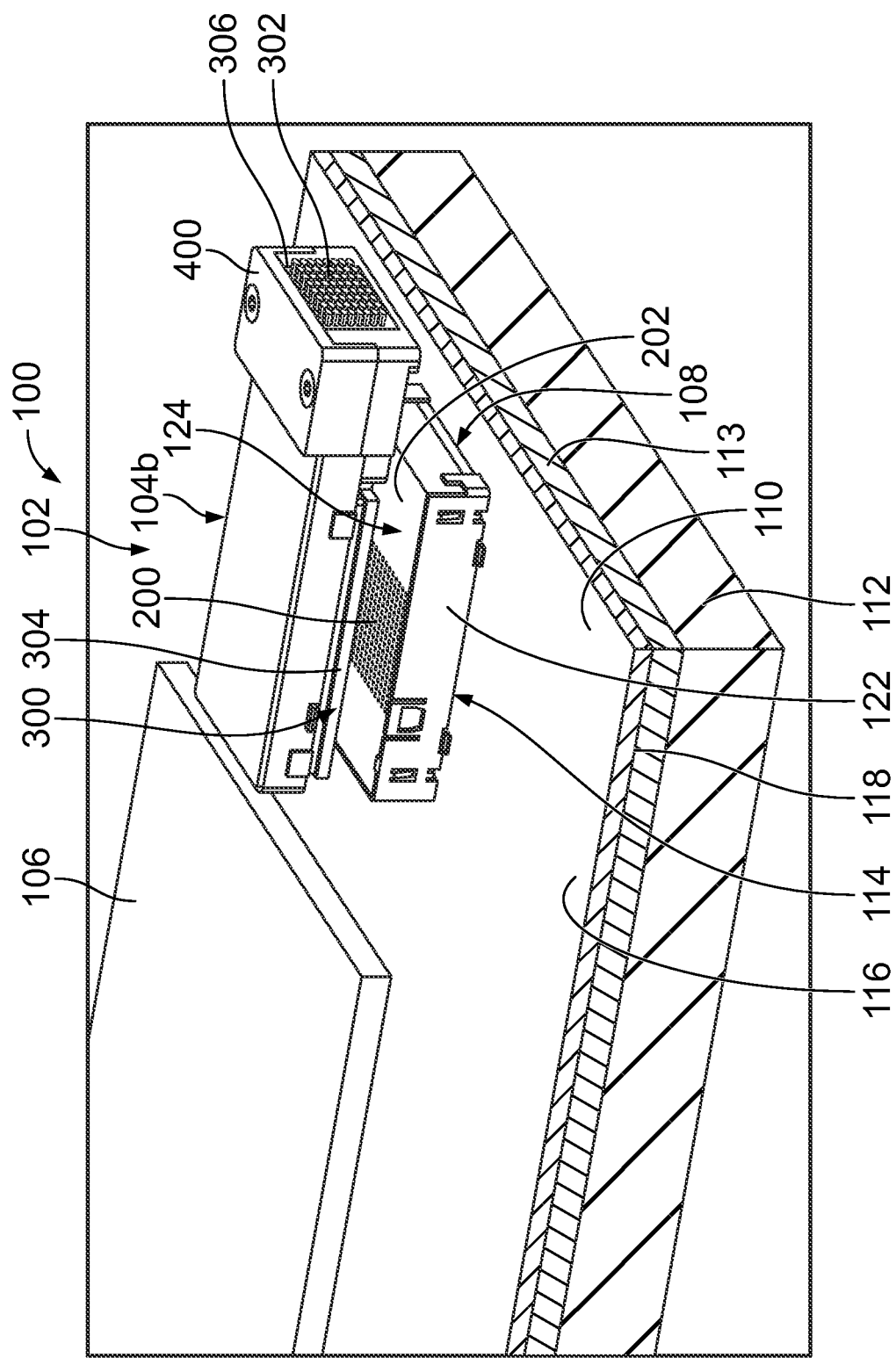
FIG. 2 is an exploded view of the communication system in accordance with an exemplary embodiment showing the electronic assembly and the circuit board.

FIG. 2 is an exploded view of the communication system 100 in accordance with an exemplary embodiment showing the electronic assembly 102 and the circuit board 110. The electronic assembly 102 includes the cable connector module 104 and the interposer assembly 108. The interposer assembly 108 is used to electrically connect the cable connector module 104 to the circuit board 110. In the illustrated embodiment, the cable connector module 104 is the electrical module 104b having cable conductors.

In an exemplary embodiment, the electronic assembly 102 includes a bolster plate 112 used to secure the cable connector module 104 to the circuit board 110. The bolster plate 112 is located below a lower surface 118 of the circuit board 110. The bolster plate 112 may be mounted directly to the lower surface 118. In other various embodiments, the bolster plate 112 may be located below the host circuit board 113. The bolster plate 112 may strengthen or provide rigidity to the circuit board 110 and/or the host circuit board 113.

The circuit board 110 includes a mounting area 114 on an upper surface 116 of the circuit board 110. The mounting area 114 may be located adjacent the electronic package 106 (shown in FIG. 1). The circuit board 110 includes board contacts (not shown) at the mounting area 114. The board contacts are arranged in an array, such as in rows and columns. The board contacts may be pads or traces of the circuit board 110. The board contacts may be high speed signal contacts, sideband signal contacts, ground contacts, or power contacts. The interposer assembly 108 is coupled to the circuit board 110 at the mounting area 114.

In an exemplary embodiment, the electronic assembly 102 includes a socket 122 having a cavity 124 that receives the interposer assembly 108. The cable connector module 104 is configured to be plugged into the cavity 124 of the socket 122 to mate with the interposer assembly 108. The socket 122 guides mating of the cable connector module 104 with the interposer assembly 108. The socket 122 may include securing features to secure the cable connector module 104 in the socket 122.

The interposer assembly 108 includes an array of interposer contacts 200 held together by a support plate 202. The support plate 202 is manufactured from an insulative material, such as a polyimide material, to electrically isolate the interposer contacts 200 from one another. In an exemplary embodiment, the interposer contacts 200 are compressible contacts, such as conductive polymer columns. Other types of interposer contacts 200 may be utilized in alternative embodiments. Each interposer contact 200 includes an upper mating interface and a lower mating interface.

The interposer assembly 108 is positioned in the cavity 124 of the socket 122. The socket 122 includes walls at least partially surrounding the cavity 124. In the illustrated embodiment, the cable connector module 104 is plugged into the socket 122 from above. The cable connector module 104 is configured to be mated with the interposer contacts 200 of the interposer assembly 108.

The cable connector module 104 includes a cable card assembly 300 having a plurality of cables 302 terminated to a circuit card 304, such as being soldered to the circuit card 304. The cable card assembly 300 includes a cable holder 306 that holds the cables 302 relative to the circuit card 304. The cable connector module 104 may include a heat transfer element (not shown) thermally coupled to the cable card assembly 300, such as to dissipate heat from components on the circuit card 304. The cable connector module 104 includes a connector shell 400 that holds the cable card assembly 300. The connector shell 400 is configured to be coupled to the socket 122 and/or the circuit board 110 and/or the stiffener plate 111 and/or the host circuit board 113 and/or the bolster plate 112 using mounting hardware. The connector shell 400 holds the cable card assembly 300 for mating with the interposer assembly 108.

The cable holder 306 is coupled to the cables 302 and holds the cables 302 relative to each other. The cable holder 306 is coupled to the circuit card 304 to hold the cables 302 relative to the circuit card 304. The cable holder 306 provides strain relief for the cables 302. The circuit card 304 is coupled to the connector shell 400 to position the mating interface of the circuit card 304 for mating with the interposer assembly 108. The cable holder 306 is coupled to the connector shell 400 to position the cables 302 relative to the connector shell 400. The connector shell 400 is configured to be coupled to the socket 122, such as to the walls of the socket 122, to position the cable connector module 104 in the cavity 124. The socket 122 positions the connector shell 400, and thus the circuit card 304, in the cavity 124 for mating with the interposer assembly 108.

Figure 3:
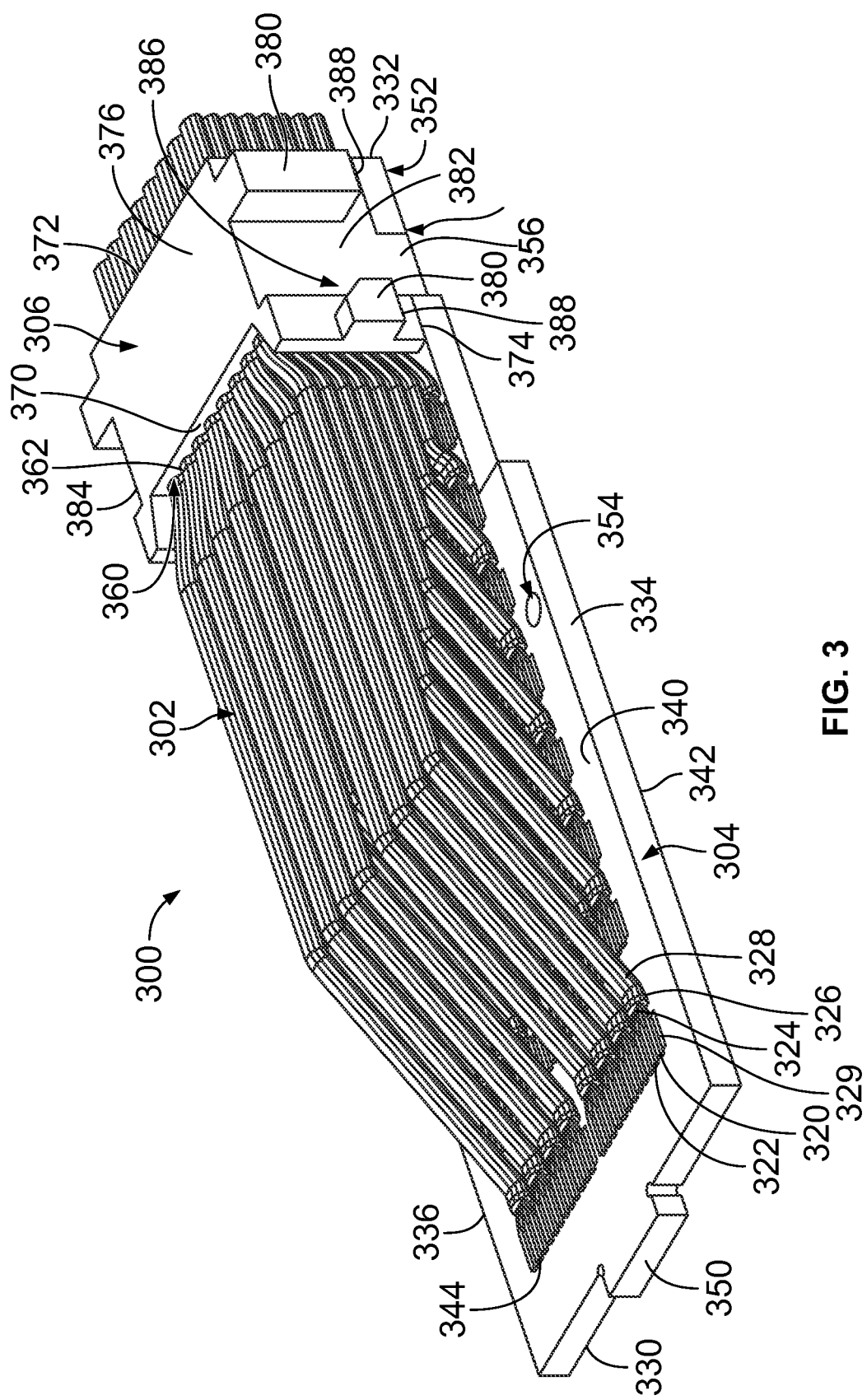
FIG. 3 is a top perspective view of the cable card assembly in accordance with an exemplary embodiment.
Figure 4:
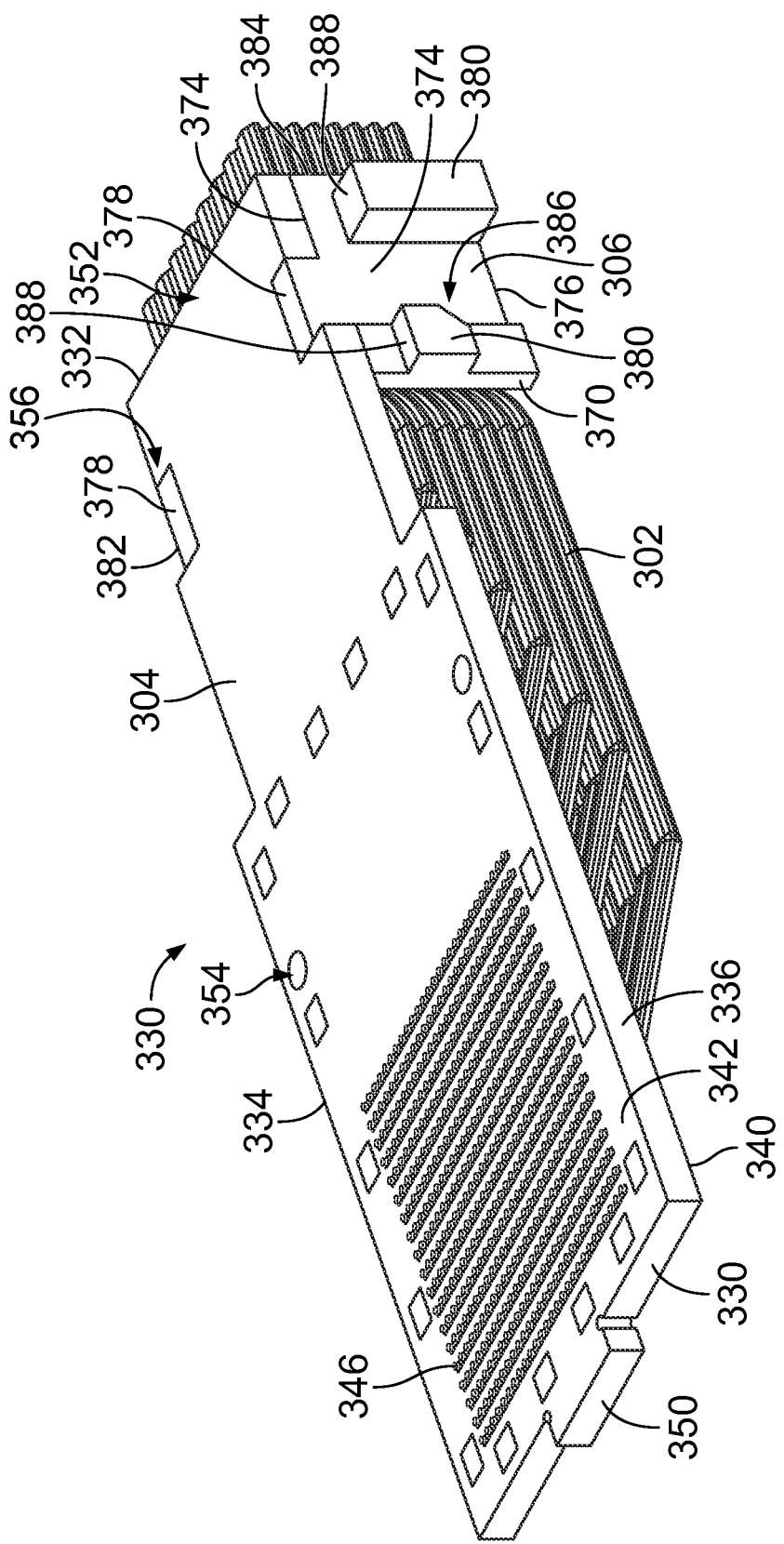
FIG. 4 is a bottom perspective view of the cable card assembly in accordance with an exemplary embodiment.

FIG. 3 is a top perspective view of the cable card assembly 300 in accordance with an exemplary embodiment. FIG. 4 is a bottom perspective view of the cable card assembly 300 in accordance with an exemplary embodiment. The cable card assembly 300 includes the circuit card 304, the cables 302, and the cable holder 306. In the illustrated embodiment, the cables are provided in multiple rows. The cables 302 are configured to be terminated to the circuit card 304, such as being soldered to the circuit card 304. The cable holder 306 is coupled to the cables 302 and holds the cables 302 relative to each other and relative to the circuit card 304.

Each cable 302 includes at least one signal conductor and a shield structure providing electrical shielding for the at least one signal conductor. In an exemplary embodiment, the cables 302 are twin-axial cables. For example, each cable 302 includes a first signal conductor 320 and a second signal conductor 322. The signal conductors 320, 322 carry differential signals. The signal conductors 320, 322 are configured to be electrically connected to corresponding cable conductors of the circuit card 304. The cable 302 includes an insulator 324 surrounding the signal conductors 320, 322 and a cable shield 326 surrounding the insulator 324. The cable shield 326 provides circumferential shielding around the signal conductors 320, 322. The cable 302 includes a cable jacket 328 surrounding the cable shield 326. In various embodiments, the cable 302 includes one or more drain wires 329 electrically connected to the cable shield 326. The drain wire(s) 329 are configured to be terminated to the circuit card 304, such as being soldered to cable conductors of the circuit card 304. In various embodiments, a separate ground shield (not shown) may be coupled to the circuit card 304 to provide shielding around the exposed portions of the signal conductors 320, 322.

In an exemplary embodiment, the cable jacket 328, the cable shield 326, and the insulator 324 may be removed (e.g., stripped) to expose portions of the signal conductors 320, 322. The exposed portions of the signal conductors 320, 322 are configured to be mechanically and electrically coupled (e.g., soldered) to corresponding cable conductors on the circuit card 304. The exposed portions may be bent, such as bent inward toward each other (distance between reduced for tighter coupling and smaller trace spacing) and/or may be bent toward the circuit card 304 to terminate to the cable conductors.

The circuit card 304 extends between a front 330 and a rear 332 opposite the front 330. The circuit card 304 includes a first side 334 and a second side 336 opposite the first side 334 extending between the front 330 and the rear 332. The circuit card 304 may have any reasonable length between the front 330 and the rear 332, depending on the particular application, and may have electrical components mounted to the circuit card 304 between the front 330 and the rear 332. The circuit card 304 includes an upper surface 340 and a lower surface 342 opposite the upper surface 340.

In an exemplary embodiment, the circuit card 304 includes cable conductors 344 at the upper surface 340 configured to be electrically connected to the signal conductors 320, 322 of the cables 302. The cable conductors 344 may be pads or traces of the circuit card 304. In the illustrated embodiment, the cable conductors 344 are all provided on the upper surface 340. However, in alternative embodiments, the cable conductors 344 may additionally be provided of the lower surface 342. The cable conductors 344 include both signal conductors and ground conductors. The ground conductors may be electrically connected to a ground plane (not shown) of the circuit card 304. Optionally, the cable conductors 344 may be arranged in a ground-signal-signal-ground arrangement. In the illustrated embodiment, the cable conductors 344 are provided in multiple rows along the circuit card 304, such as along a majority of the length of the circuit card 304 between the front 330 and the rear 332. As such, the circuit card 304 is densely populated with the cable conductors 344 to allow a large number of cables 302, and thus a large number of signal lines, to be electrically connected to the circuit card 304.

The circuit card 304 includes mating conductors 346 at the lower surface 342 configured to be electrically connected to corresponding interposer contacts 200 of the interposer assembly 108 (both shown in FIG. 2). The mating conductors 346 may be pads or traces of the circuit card 304. The mating conductors 346 are electrically connected to corresponding cable conductors 344 through traces, vias or other circuits of the circuit card 304. The mating conductors 346 include both signal conductors and ground conductors. The ground mating conductors 346 may be electrically connected to the ground plane of the circuit card 304. In the illustrated embodiment, the mating conductors 346 are provided proximate to the front 330; however, other locations are possible in alternative embodiments. In an exemplary embodiment, the mating conductors 346 are all provided on the lower surface 342. However, the mating conductors 346 may be provided on both the upper surface 340 and the lower surface 342 in alternative embodiments, such as when the circuit card 304 is a pluggable card configured to be plugged into a card slot of a receptacle connector.

In an exemplary embodiment, the circuit card 304 includes a front retaining tab 350 at the front 330 and a rear retaining tab 352 at the rear 332. The retaining tabs 350, 352 are used to retain the cable card assembly 300 and the connector shell 400 (shown in FIG. 2). For example, the front retaining tab 350 is configured to be coupled to the connector shell 400 to retain the front 330 of the circuit card 304 within the connector shell 400 and the rear retaining tab 352 is configured to be coupled to the connector shell 400 to retain the rear 332 of the circuit card 304 within the connector shell 400. In the illustrated embodiment, the front retaining tab 350 is a protrusion extending forward at the front 330. The front retaining tab 350 is narrower than the overall width of the circuit card 304. The front retaining tab 350 may have other shapes in alternative embodiments. In the illustrated embodiment, the rear retaining tab 352 is defined by the rear portion of the circuit card 304 at the rear 332. The rear retaining tab 352 extends the entire width of the circuit card 304. The rear retaining tab 352 may have other shapes in alternative embodiments, such as a protrusion extending rearward from the rear 332 that is narrower than the overall width of the circuit card 304. In an exemplary embodiment, the circuit card 304 is configured to be retained in the connector shell 400 using only the front and rear retaining tabs 350, 352. For example, the sides 334, 336 are devoid of the retaining features, which eliminates the need for increasing the side to side footprint of the cable card assembly 300. The assembly process may be simplified using the retaining tabs 350, 352 rather than complicated latching components and/or additional hardware.

In an exemplary embodiment, the circuit card 304 includes locating features 354 for locating the circuit card 304 relative to the connector shell 400. In the illustrated embodiment, the locating features 354 are openings configured to receive locating posts of the connector shell 400 to locate the circuit card 304 relative to the connector shell 400. Other types of locating features may be used in alternative embodiments. For example, edges of the circuit card 304 may be used as locating features in alternative embodiments.

In an exemplary embodiment, the circuit card 304 includes connecting features 356 for connecting the cable holder 306 to the circuit card 304. In the illustrated embodiment, the connecting features 356 are cutouts or openings in the circuit card 304 that receive portions of the cable holder 306. The connecting features 356 may be provided at various locations along the circuit card 304. In the illustrated embodiment, the connecting features 356 are located proximate to the rear 332, such as at the first side 334 and the second side 336. Other locations are possible in alternative embodiments, such as at an interior location of the circuit card 304 remote from the first side 334 and remote from the second side 336 such that the circuit card 304 surrounds the connecting feature 356. The connecting features 356 secure the cable holder 306 to the circuit card 304. The connecting features 356 locate the cable holder 306 relative to the circuit card 304, such as for locating the cable holder 306 relative to the connector shell 400.

In an exemplary embodiment, the cable holder 306 is used for holding the cables 302 relative to each other and for holding the cables 302 relative to the circuit card 304. The cable holder 306 includes cable channels 360 extending through the cable holder 306. Each cable channel 360 receives the corresponding cable 302. The cable holder 306 includes separating walls 362 between the cable channels 360. The separating walls 362 separate the cables 302 from each other. In various embodiments, the cable channels 360 are arranged in rows and columns extending through the cable holder 306. The separating walls 362 of the cable holder 306 extend horizontally and vertically between the cable channels 360.

In an exemplary embodiment, the cable holder 306 is manufactured from a dielectric material. The cable holder 306 may be a molded plastic piece. In an exemplary embodiment, the cable holder 306 is formed in place on the cables 302 and the circuit card 304 after the cables 302 are terminated to the circuit card 304. For example, the cable holder 306 may be an injection molded piece formed in situ on the circuit card 304 and the cables 302. The injection molded material fills the spaces between the cables 302 to form the separating walls 362. In alternative embodiments, the cable holder 306 may be molded separate from the cables 302 and/or the circuit card 304 and assembled to the cables 302 and/or the circuit card 304 during an assembly process.

The cable holder 306 extends between a front 370 and a rear 372. The rear 372 of the cable holder 306 may be aligned with the rear 332 of the circuit card 304. The cable holder 306 has an inner end 374 facing the circuit card 304 and an outer end 376 opposite the inner end 374. In an exemplary embodiment, the cable holder 306 includes connecting tabs 378 for connecting the cable holder 306 to the circuit card 304. In the illustrated embodiment, the connecting tabs 378 are provided at the inner end 374. The connecting tabs 378 interface with the connecting features 356 of the circuit card 304. For example, the connecting tabs 378 are received in the connecting features 356 to position the cable holder 306 relative to the circuit card 304. In an exemplary embodiment, when the cable holder 306 is formed in place on the circuit card 304, the material of the cable holder 306 is molded into place to fill the openings defining the connecting features 356. When the material cures, the cable holder 306 is locked in place on the circuit card 304.

In an exemplary embodiment, the cable holder 306 includes guide lugs 380 extending from a first side 382 and the second side 384 of the cable holder 306. The guide lugs 380 protrude outward from the first and second sides 382, 384. The guide lugs 380 are configured to be coupled to the connector shell 400. The guide lugs 380 may guide mating of the cable holder 306 with the connector shell 400, such as proximate to the front 370 and proximate to the rear 372. In the illustrated embodiment, a pair of the guide lugs 380 are provided on each side 382, 384. However, greater or fewer guide lugs 380 may be provided in alternative embodiments. The guide lugs 380 may have different sizes and/or shapes, such as with the front guide lug 380 being shorter than the rear guide lugs 380. In the illustrated embodiment, the front guide lug 380 includes a cutout 386 to change the shape of the front guide lug 380. The cutout 386 may be used to help load the cable holder 306 into the connector shell 400. In an exemplary embodiment, the guide lugs 380 include a ledge or shoulder 388 at the bottom of the guide lug 380. The shoulder 388 forms a retention surface for retaining the cable holder 306 in the connector shell 400.

Figure 5:
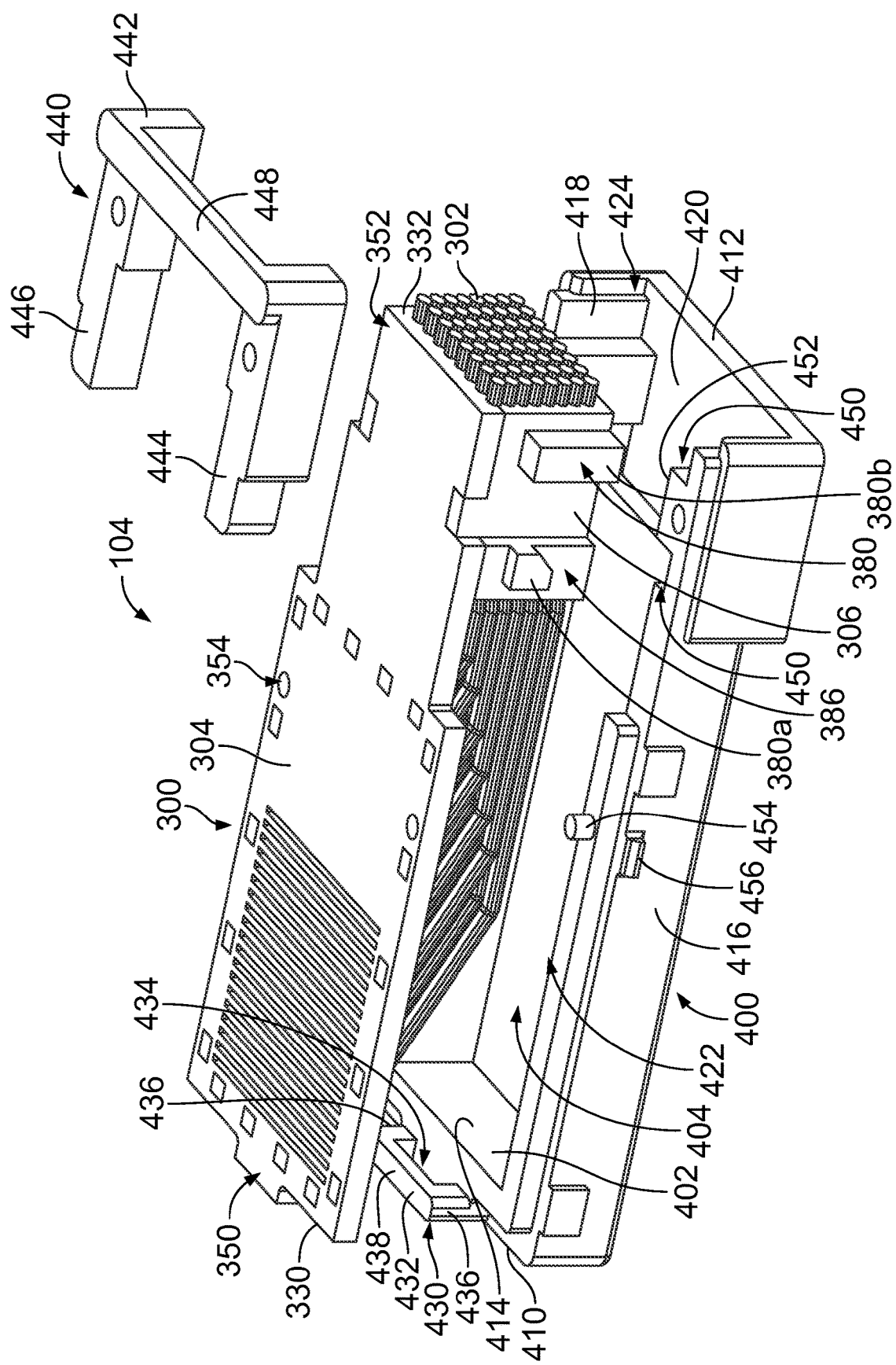
FIG. 5 is a bottom perspective, exploded view of the cable connector module in accordance with an exemplary embodiment.

FIG. 5 is a bottom perspective, exploded view of the cable connector module 104 in accordance with an exemplary embodiment. FIG. 5 illustrates the cable card assembly 300 poised for coupling to the connector shell 400.

The connector shell 400 includes a plurality of walls 402 forming a cavity 404 that receives the cable card assembly 300. The connector shell 400 extends between a front 410 and a rear 412. The connector shell 400 includes a front wall 414 at the front 410. The connector shell 400 includes first and second side walls 416, 418 that extend between the front 410 and the rear 412. The connector shell 400 includes a top wall 420 that extends between the front 410 and the rear 412. In an exemplary embodiment, the connector shell 400 includes a bottom opening 422 at the bottom that receives the cable card assembly 300. A portion of the cable card assembly 300 may protrude through the bottom opening 422 for mating with the interposer assembly 108 (FIG. 2). In an exemplary embodiment, the connector shell 400 includes a rear opening 424 at the rear 412. A portion of the cable card assembly 300 extends through the rear opening 424. For example, the cables 302 of the cable card assembly 300 may extend from the rear 412 of the connector shell 400. In an exemplary embodiment, the cables 302 extend into the cavity 404, such as between the circuit card 304 and the top wall 420. The cable holder 306 is received in the cavity 404. In an exemplary embodiment, the circuit card 304 is received in the cavity 404. The circuit card 304 may be located at the bottom of the connector shell 400. The cavity 404 is sized and shaped to receive the circuit card 304, the cables 302, and the cable holder 306.

In an exemplary embodiment, the connector shell 400 includes a front retainer 430 at the front 410 and a rear retainer 440 at the rear 412. The front retainer 430 receives the front retaining tab 350 to secure the front 330 of the circuit card 304 to the connector shell 400. The front retainer 430 directly engages the front retaining tab 350 to retain the circuit card 304 in the cavity 404. The rear retainer 440 receives the rear retaining tab 352 to secure the rear 332 of the circuit card 304 to the connector shell 400. The rear retainer 440 directly engages the rear retaining tab 352 to retain the circuit card 304 in the cavity 404. In the illustrated embodiment, the rear retainer 440 is separate and discrete from the main body of the connector shell 400. The rear retainer 440 is configured to be coupled to the main body of the connector shell 400 after the cable card assembly 300 is loaded into the cavity 404.

In an exemplary embodiment, the front retainer 430 includes a latch 432 having an opening 434 that receives the front retaining tab 350. The latch 432 includes legs 436 and a connecting beam 438 between the legs 436 that define the opening 434. The front retaining tab 350 is configured to be captured in the opening 434 by the legs 436 and the connecting beam 438. The legs 436 prevent side to side movement of the circuit card 304 relative to the front retainer 430. The connecting beam 438 prevents liftoff of the circuit card 304 from the connector shell 400 to retain the front retaining tab 350 in the opening 434. In an exemplary embodiment, the front retaining tab 350 may be rear loaded into the opening 434. In an exemplary embodiment, the circuit card 304 may be pivoted or rotated into the cavity 404 by initially loading the front retaining tab 350 into the opening 434 at an angle prior to loading the rear portion of the circuit card 304 into the cavity 404.

In an exemplary embodiment, the rear retainer 440 includes a bracket 442 having a first side arm 444, a second side arm 446, and a connecting beam 448 between the first and second side arms 444, 446. The first and second side arms 444, 446 are configured to be coupled to the side walls 416, 418 of the connector shell 400. The connecting beam 448 is configured to extend across the rear retaining tab 352 to capture the rear retaining tab 352 in the cavity 404 of the connector shell 400. The rear retainer 440 may be coupled to the main body of the connector shell 400 using fasteners, such as threaded screws.

In an exemplary embodiment, the connector shell 400 includes guide slots 450 in the side walls 416, 418. The guide slots 450 receive the guide lugs 380 of the cable holder 306. In an exemplary embodiment, guide rails 452 are located between the guide slots 450. The guide slots 450 are open at the bottom to receive the guide lugs 380. In an exemplary embodiment, the front guide lugs 380a are shorter than the rear guide lugs 380b to allow the pivoting or rotating of the cable card assembly 300 during assembly. For example, the cutouts 386 associated with the front guide lugs 380a accommodate the pivoting movement of the cable card assembly 300 during assembly. In other various embodiments, the guide slots 450 may be shaped to accommodate the pivoting movement of the cable card assembly 300 during assembly.

In an exemplary embodiment, the connector shell 400 includes locating posts 454 that receive the locating features 354 of the circuit card 304. The locating posts 454 extend from the bottom edges of the side walls 416, 418. The locating posts 454 are configured to be received in the openings defining the locating features 354. The locating posts 454 may locate the circuit card 304 front to rear and/or side-to-side relative to the connector shell 400.

In an exemplary embodiment, the connector shell 400 includes latching features 456 extending from the exterior of the side walls 416, 418. The latching features 456 are used to latchably connect the connector shell 400 to the socket 122 (FIG. 2). Other types of securing features may be used in alternative embodiments.

Figure 6:
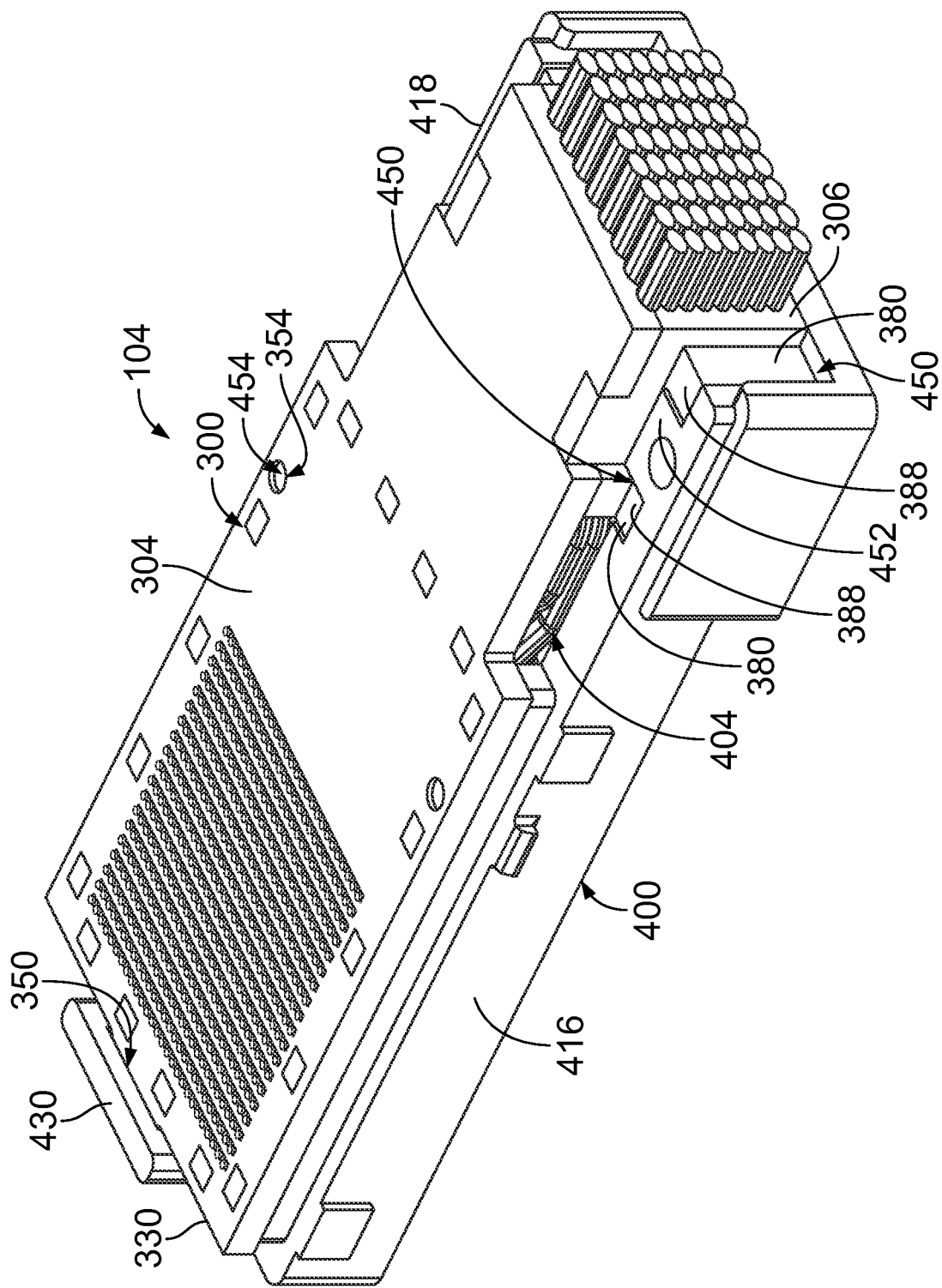
FIG. 6 is a bottom perspective view of the cable connector module in accordance with an exemplary embodiment in a partially assembled state.

FIG. 6 is a bottom perspective view of the cable connector module 104 in accordance with an exemplary embodiment in a partially assembled state. The cable card assembly 300 is shown coupled to the connector shell 400. The front retaining tab 350 is coupled to the front retainer 430 to secure the front 330 of the circuit card 304. The locating posts 454 are shown received in the locating features 354 to locate the circuit card 304 relative to the connector shell 400.

When assembled, the guide lugs 380 of the cable holder 306 are received in the guide slots 450. The guide lugs 380 are located on opposite sides of the corresponding guide rails 452. The guide rail 452 may limit front to rear movement of the cable holder 306 relative to the connector shell 400. In an exemplary embodiment, the shoulders 388 of the guide lugs 380 are located in the guide slots 450. The shoulders 388 may be approximately aligned with the bottom edges of the side walls 416, 418. For example, the shoulders 388 may be co-planer with the bottom of the guide rail 452. When the connector shell 400 receives the rear retainer 440, the rear retainer 440 is configured to capture the guide lugs 380 in the guide slots 450. The rear retainer 440 is configured to cover the shoulders 388 and block removal of the guide lugs 380 from the guide slots 450 and thus retain the cable holder 306 in the cavity 404 of the connector shell 400.

Figure 7:
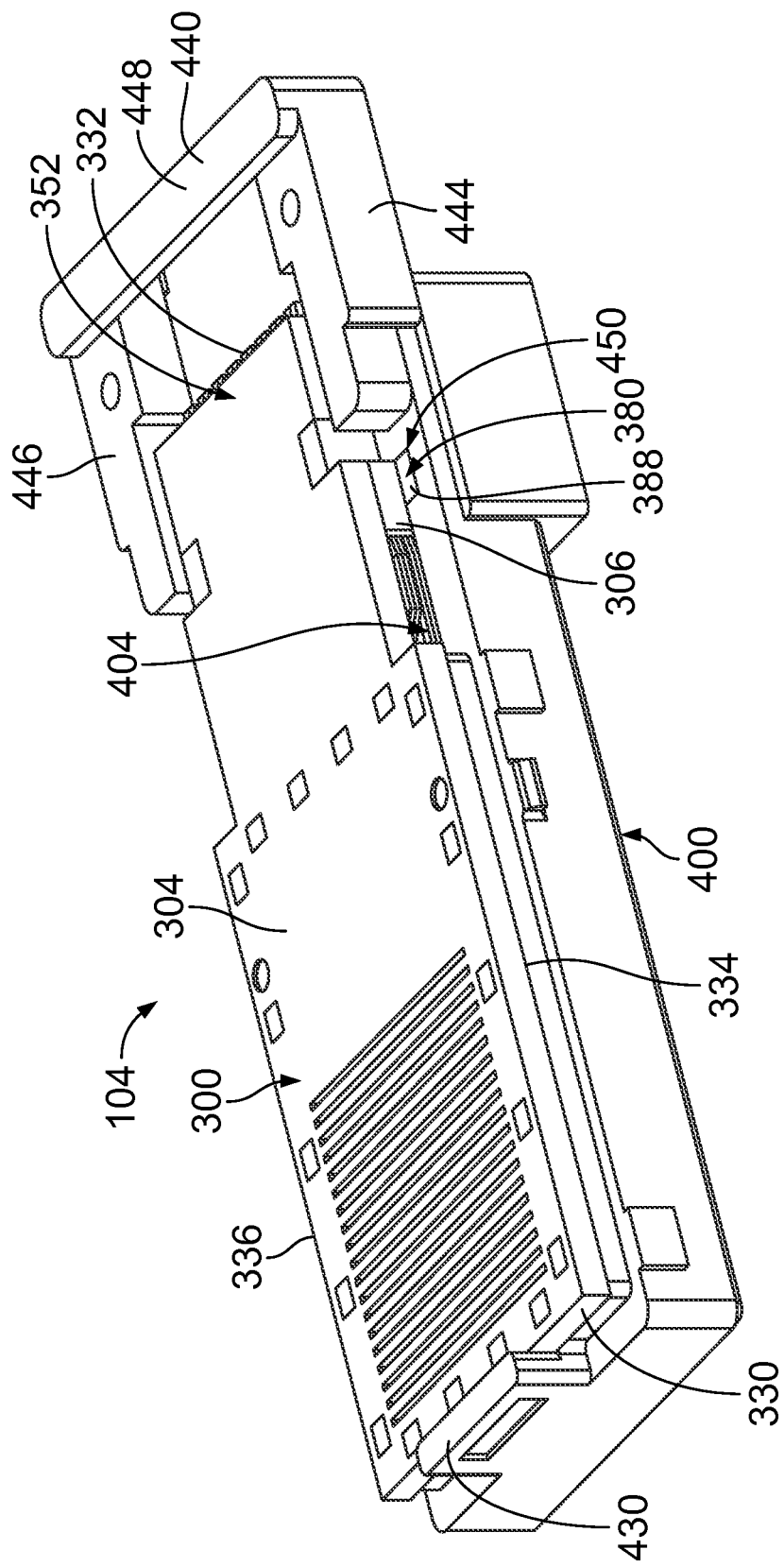
FIG. 7 is a bottom perspective view of the cable connector module in accordance with an exemplary embodiment in a partially assembled state.
Figure 8:
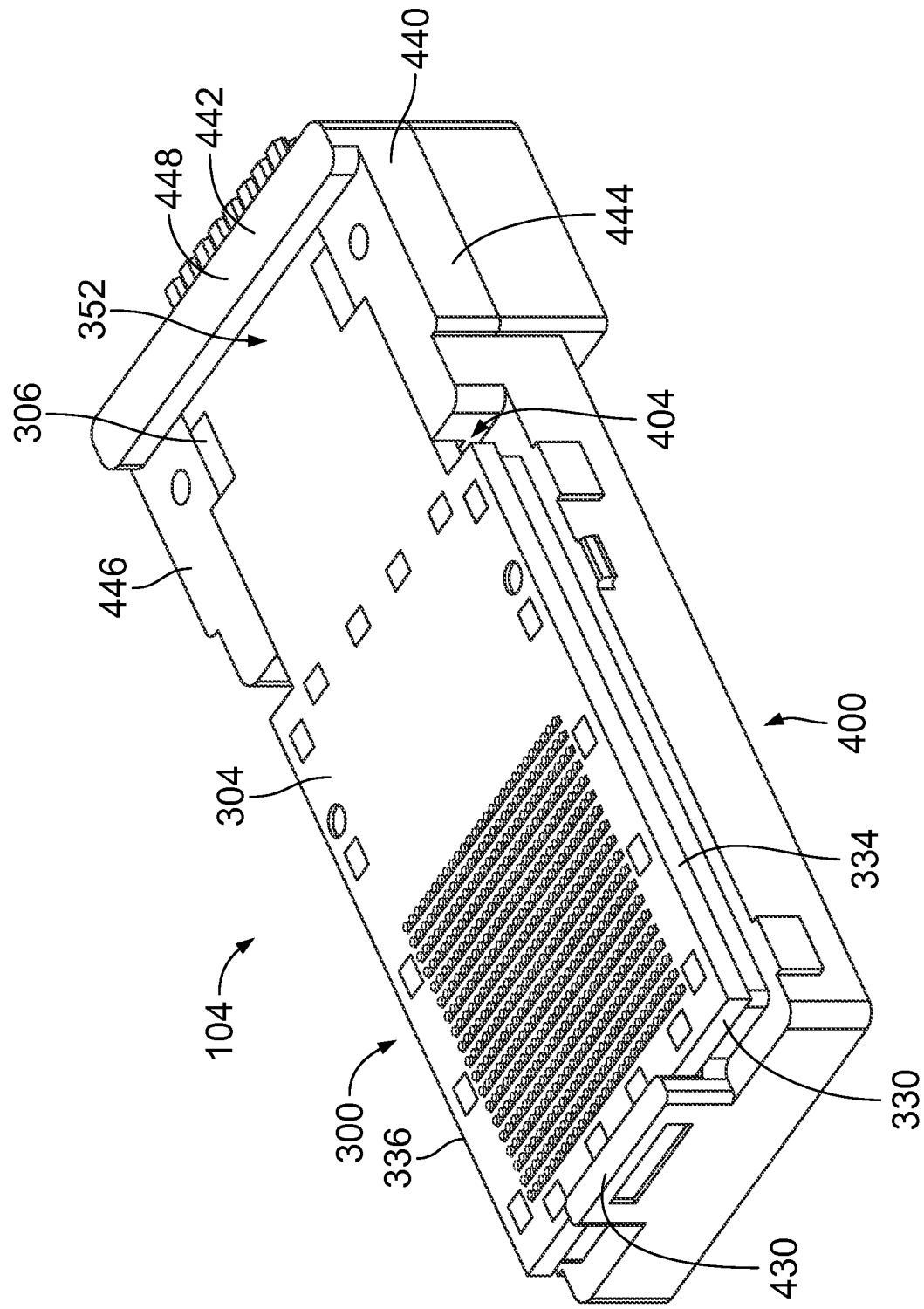
FIG. 8 is a bottom perspective view of the cable connector module in accordance with an exemplary embodiment in an assembled state.

FIG. 7 is a bottom perspective view of the cable connector module 104 in accordance with an exemplary embodiment in a partially assembled state. FIG. 8 is a bottom perspective view of the cable connector module 104 in accordance with an exemplary embodiment in an assembled state. FIG. 7 shows the rear retainer 440 poised for coupling to the main body of the connector shell 400. FIG. 8 shows the rear retainer 440 positioned on the main body of the connector shell 400 and coupled thereto.

During assembly, after the cable card assembly 300 is loaded into the cavity 404 of the connector shell 400, the rear retainer 440 is coupled to the main body of the connector shell 400 to retain the rear portion of the cable card assembly 300 in the connector shell 400. The rear retainer 440 may be slidably coupled to the main body of the connector shell 400 from behind the connector shell 400. The rear retainer 440 is slid into a final position such that the bracket 442 covers the rear portion of the cable card assembly 300 to retain the cable card assembly 300 in the connector shell 400. The side arms 444, 446 of the bracket 442 cover the shoulders 388 of the guide lugs 380 of the cable holder 306 to retain the guide lugs 380 in the guide slots 450. The connecting beam 448 of the bracket 442 covers the rear retaining tab 352 to retain the circuit card 304 in the connector shell 400. For example, the connecting beam 448 covers the rear edge of the circuit card 304 to prevent liftoff or rotation of the circuit card 304.

When assembled, the circuit card 304 is retained at the front 330 by the front retainer 430 and the circuit card 304 is retained at the rear 332 by the rear retainer 440. In an exemplary embodiment, the circuit card 304 is only secured to the connector shell 400 using the front and rear retainers 430, 440. The sides 334, 336 of the circuit card 304 are devoid of retaining features for retaining the circuit card 304 to the connector shell 400.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the invention without departing from its scope. Dimensions, types of materials, orientations of the various components, and the number and positions of the various components described herein are intended to define parameters of certain embodiments, and are by no means limiting and are merely exemplary embodiments. Many other embodiments and modifications within the spirit and scope of the claims will be apparent to those of skill in the art upon reviewing the above description. The scope of the invention should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. § 112(f), unless and until such claim limitations expressly use the phrase "means for" followed by a statement of function void of further structure.

What is claimed is:

1. A cable connector module comprising:
    a cable card assembly including a circuit card, cables terminated to the circuit card, and a cable holder coupled to the circuit card and holding the cables relative to the circuit card, the circuit card including mating contacts configured for mating with interposer contacts of an interposer assembly, the circuit card including cable contacts, the cables including cable conductors electrically connected to the corresponding cable contacts, the cable holder holding each of the contacts, the cable holder including at least one connecting tab coupled to the circuit card, the circuit card including a front retaining tab at the front and a rear retaining tab at the rear; and
    a connector shell having a cavity that receives the cable card assembly, the connector shell having a front and a rear, the connector shell having sides between the front and the rear, the connector shell having a top wall between the front and the rear, the connector shell including a front retainer at the front receiving the front retaining tab to hold the front of the circuit card relative to the connector shell, the connector shell including a rear retainer at the rear receiving the rear retaining tab to hold the rear of the circuit card relative to the connector shell.

2. The cable connector module of claim 1, wherein the circuit card is only secured to the connector shell using the front and rear retainers.

3. The cable connector module of claim 1, wherein the sides are devoid of retaining features for retaining the circuit card to the connector shell.

4. The cable connector module of claim 1, wherein the front retainer includes a latch surrounding an opening, the front retaining tab being plugged into the opening and retained in the opening by the latch.

5. The cable connector module of claim 1, wherein the front retaining tab is rear loaded into the front retainer, the rear of the circuit card being pivoted into the cavity after the front retaining tab is loaded into the front retainer.

6. The cable connector module of claim 1, wherein the connector shell includes guide slots in the sides, the cable holder including guide lugs at sides of the cable holder received in the guide slots to guide mating of the cable card assembly with the connector shell.

7. The cable connector module of claim 6, wherein the rear retainer engages the guide lugs to retain the cable holder in the cavity.

8. The cable connector module of claim 1, wherein the rear retainer includes a bracket separate and discrete from the connector shell, the bracket being coupled to the connector shell after the circuit card is received in the cavity to retain the circuit card in the cavity.

9. The cable connector module of claim 8, wherein the bracket is slidably coupled to the connector shell.

10. The cable connector module of claim 8, wherein the cable holder includes a guide lug coupled to the connector shell, the guide lug including a shoulder, the bracket engaging the shoulder to retain the guide lug in the connector shell.

11. The cable connector module of claim 8, wherein the bracket includes a first side arm, a second side arm, and a connecting beam between the first and second side arms, the first and second side arms being connected to the sides of the connector shell, the connecting beam extending along the rear of the circuit card to retain the rear of the circuit card in the cavity of the connector shell.

12. The cable connector module of claim 1, wherein the cable holder is molded in place over the cables and onto the circuit card to retain the cables relative to the circuit card and provide strain relief for the cables.

13. A cable connector module comprising:
    a cable card assembly including a circuit card, cables terminated to the circuit card, and a cable holder coupled to the circuit card and holding the cables relative to the circuit card, the circuit card including mating contacts configured for mating with interposer contacts of an interposer assembly, the circuit card including cable contacts, the cables including cable conductors electrically connected to the corresponding cable contacts, the cable holder holding each of the contacts, the cable holder including at least one connecting tab coupled to the circuit card, the cable holder including guide lugs along first and second sides of the cable holder; and
    a connector shell having a cavity that receives the cable card assembly, the connector shell having a front and a rear, the connector shell having first and second sides between the front and the rear, the connector shell having a top wall between the front and the rear, the connector shell including guide slots formed in the first and second sides proximate to the rear of the connector shell, the guide slots receiving the guide lugs of the cable holder, the connector shell including a retainer coupled to the rear of the connector shell, the retainer covering the guide lugs to retain the cable holder in the cavity and hold the circuit card relative to the connector shell.

14. The cable connector module of claim 13, wherein the circuit card including a front retaining tab at the front and a rear retaining tab at the rear, the connector shell including a front retainer at the front receiving the front retaining tab to hold the front of the circuit card relative to the connector shell, the retainer of the connector shell receiving the rear retaining tab to hold the rear of the circuit card relative to the connector shell.

15. The cable connector module of claim 13, wherein the guide lugs include shoulders, the retainer engaging the shoulders to retain the cable holder in the cavity.

16. The cable connector module of claim 13, wherein the retainer includes a bracket separate and discrete from the connector shell, the bracket being coupled to the connector shell after the circuit card is received in the cavity, the bracket covering the guide lugs to retain the guide lugs in the cavity.

17. The cable connector module of claim 16, wherein the bracket includes a first side arm, a second side arm, and a connecting beam between the first and second side arms, the first and second side arms being connected to the sides of the connector shell to cover the guide lugs at the first and second sides of the cable holder, the connecting beam extending along the rear of the circuit card to retain the rear of the circuit card in the cavity of the connector shell.

18. The cable connector module of claim 13, wherein the cable holder is molded in place over the cables and onto the circuit card to retain the cables relative to the circuit card and provide strain relief for the cables.

19. An electronic assembly comprising:
an interposer assembly including an array of interposer contacts, the interposer contacts being compressible, each interposer contact having an upper mating interface and a lower mating interface, the upper mating interfaces defining separable mating interfaces, the lower mating interfaces of the interposer contacts configured to be electrically connected to board contacts of a circuit board; and
a cable connector module coupled to the interposer assembly, the cable connector module including a cable card assembly and a connector shell having a cavity that receives the cable card assembly, the cable card assembly including a circuit card, cables terminated to the circuit card, and a cable holder coupled to the circuit card and holding the cables relative to the circuit card, the circuit card including mating contacts configured for mating with interposer contacts of an interposer assembly, the circuit card including cable contacts, the cables including cable conductors electrically connected to the corresponding cable contacts, the circuit card including a front retaining tab at the front and a rear retaining tab at the rear, the cable holder holding each of the contacts, the cable holder including at least one connecting tab coupled to the circuit card, the cable holder including guide lugs along first and second sides of the cable holder, the connector shell having a front and a rear, the connector shell having first and second sides between the front and the rear, the connector shell having a top wall between the front and the rear, the connector shell including guide slots formed in the first and second sides proximate to the rear of the connector shell, the guide slots receiving the guide lugs of the cable holder, the connector shell including a front retainer at the front receiving the front retaining tab to hold the front of the circuit card relative to the connector shell, the connector shell including a rear retainer at the rear receiving the rear retaining tab to hold the rear of the circuit card relative to the connector shell, the rear retainer covering the guide lugs to retain the cable holder in the cavity.

20. The electronic assembly of claim 19, wherein the rear retainer includes a bracket separate and discrete from the connector shell, the bracket being coupled to the connector shell after the circuit card is received in the cavity, the bracket includes a first side arm, a second side arm, and a connecting beam between the first and second side arms, the first and second side arms being connected to the sides of the connector shell to cover the guide lugs at the first and second sides of the cable holder, the connecting beam extending along the rear of the circuit card to retain the rear of the circuit card in the cavity of the connector shell.

* * * * *